United States Patent
Huang et al.

(10) Patent No.: US 11,322,345 B2
(45) Date of Patent: May 3, 2022

(54) POST-CMP CLEANING AND APPARATUS

(71) Applicant: Taiwan Semiconductor Manufacturing Company, Ltd., Hsinchu (TW)

(72) Inventors: Fu-Ming Huang, Shengang Township (TW); Liang-Guang Chen, Hsinchu (TW); Ting-Kui Chang, New Taipei (TW); Chun-Chieh Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 387 days.

(21) Appl. No.: 16/390,691

(22) Filed: Apr. 22, 2019

(65) Prior Publication Data

US 2019/0244804 A1 Aug. 8, 2019

Related U.S. Application Data

(62) Division of application No. 14/870,946, filed on Sep. 30, 2015, now Pat. No. 10,269,555.

(51) Int. Cl.

| H01L 21/02 | (2006.01) |
| H01L 21/67 | (2006.01) |
| H01L 21/687 | (2006.01) |
| H01L 21/306 | (2006.01) |
| B08B 1/00 | (2006.01) |
| B08B 1/04 | (2006.01) |
| B08B 3/04 | (2006.01) |

(52) U.S. Cl.
CPC ........ *H01L 21/02043* (2013.01); *B08B 1/002* (2013.01); *B08B 1/04* (2013.01); *B08B 3/04* (2013.01); *H01L 21/30625* (2013.01); *H01L 21/67028* (2013.01); *H01L 21/67046* (2013.01); *H01L 21/67092* (2013.01); *H01L 21/687* (2013.01); *H01L 21/02065* (2013.01); *H01L 21/02074* (2013.01)

(58) Field of Classification Search
CPC ......... H01L 21/67046; H01L 21/02043; H01L 21/30625; H01L 21/67028; H01L 21/67092; H01L 21/687; H01L 21/02065; H01L 21/02074; B08B 1/002; B08B 1/04; B08B 3/04
See application file for complete search history.

(56) References Cited

U.S. PATENT DOCUMENTS 5,675,856 A 10/1997 Itzkowitz
6,033,522 A 3/2000 Iwata et al.
(Continued)

FOREIGN PATENT DOCUMENTS

CN 101266803 A 9/2008
CN 103008298 A 4/2013
(Continued)

*Primary Examiner* — Weilun Lo
(74) *Attorney, Agent, or Firm* — Slater Matsil LLP

(57) ABSTRACT

A method includes performing a first post Chemical Mechanical Polish (CMP) cleaning on a wafer using a first brush. The first brush rotates to clean the wafer. The method further includes performing a second post-CMP cleaning on the wafer using a second brush. The second brush rotates to clean the wafer. The first post-CMP cleaning and the second post-CMP cleaning are performed simultaneously.

20 Claims, 10 Drawing Sheets

(56) References Cited

U.S. PATENT DOCUMENTS

| | | | |
|---|---|---|---|
| 6,079,073 A | 6/2000 | Maekawa | |
| 6,183,345 B1 | 2/2001 | Kamono et al. | |
| 6,438,781 B1* | 8/2002 | Ritchey, Jr. | B08B 1/04 134/140 |
| 6,572,710 B2 | 6/2003 | Middendorf et al. | |
| 6,951,042 B1 | 10/2005 | Mikhaylichenko et al. | |
| 7,077,731 B1* | 7/2006 | Zhang | B08B 1/04 451/194 |
| 7,578,886 B2 | 8/2009 | Yamada et al. | |
| 8,021,512 B2 | 9/2011 | Yun et al. | |
| 8,372,210 B2 | 2/2013 | Sin et al. | |
| 8,657,963 B2 | 2/2014 | Yeh et al. | |
| 9,089,881 B2 | 7/2015 | Wang et al. | |
| 2002/0092544 A1 | 7/2002 | Namba | |
| 2002/0160701 A1* | 10/2002 | Fehr | H01L 21/67046 451/283 |
| 2003/0109200 A1* | 6/2003 | Hall | H01L 21/31053 451/41 |
| 2004/0058630 A1* | 3/2004 | Park | B24B 37/26 451/288 |
| 2005/0109371 A1* | 5/2005 | Sin | B08B 3/02 134/6 |
| 2005/0183754 A1 | 8/2005 | Kago et al. | |
| 2008/0223402 A1 | 9/2008 | Haneda et al. | |
| 2008/0314870 A1* | 12/2008 | Inoue | H01L 21/67034 216/38 |
| 2010/0083984 A1* | 4/2010 | Ng | H01L 21/67046 134/6 |
| 2010/0212702 A1* | 8/2010 | Hamada | H01L 21/67046 134/115 R |
| 2013/0074872 A1 | 3/2013 | Yeh et al. | |
| 2013/0139851 A1 | 6/2013 | Sin et al. | |
| 2014/0248782 A1* | 9/2014 | Ishibashi | H01L 21/67046 438/746 |
| 2014/0261539 A1 | 9/2014 | Chen et al. | |
| 2014/0366913 A1* | 12/2014 | Cho | A46B 13/001 134/6 |
| 2015/0027492 A1 | 1/2015 | Takiguchi et al. | |
| 2015/0087208 A1 | 3/2015 | Tsai et al. | |
| 2015/0099433 A1* | 4/2015 | Tanaka | H01L 21/67051 451/73 |
| 2015/0170940 A1* | 6/2015 | Lin | H01L 21/67046 156/345.12 |
| 2015/0290765 A1* | 10/2015 | Otsuka | B24B 37/10 451/56 |
| 2016/0042973 A1 | 2/2016 | Yang et al. | |
| 2017/0170034 A1* | 6/2017 | Ishibashi | A46B 13/00 |

FOREIGN PATENT DOCUMENTS

| | | |
|---|---|---|
| JP | S59121939 A | 7/1984 |
| JP | 2010212295 A | 9/2010 |
| TW | 201444621 A | 12/2014 |
| TW | 201521103 A | 6/2015 |

* cited by examiner

POST-CMP CLEANING AND APPARATUS

PRIORITY CLAIM AND CROSS-REFERENCE

This application is a divisional of U.S. patent application Ser. No. 14/870,946, entitled "Post-CMP Cleaning and Apparatus," filed on Sep. 30, 2015, which application is incorporated herein by reference.

BACKGROUND

Chemical mechanical Polish (CMP) processes are widely used in the fabrication of integrated circuits. When an integrated circuit is built up layer by layer on the surface of a semiconductor wafer, CMP processes are used to planarize the topmost layer to provide a planar surface for subsequent fabrication steps. CMP processes are carried out polishing the wafer surface against a polish pad. A slurry containing both abrasive particles and reactive chemicals is applied to the polish pad. The relative movement of the polish pad and wafer surface coupled with the reactive chemicals in the slurry allows the CMP process to planarize the wafer surface by means of both physical and chemical forces.

CMP processes can be used for the fabrication of various components of an integrated circuit. For example, CMP processes may be used to planarize inter-level dielectric layers and inter-metal dielectric layers. CMP processed are also commonly used in the formation of the copper lines that interconnect the components of integrated circuits.

After a CMP process, the surface of the wafer, on which the CMP process has been performed, is cleaned to remove residues. The residues may include organic matters and particles. In recent generations of integrated circuits, the sizes of the integrated circuit devices are reduced to a very small scale. This posts a demanding requirement to the post-CMP cleaning than for older generations of integrated circuits. For example, the sizes of the metal particles that remain after the post-CMP cleaning cannot exceed a half of the critical dimension (the gate length) of the transistors on the wafer. Obviously, with the reduction of the sizes of the integrated circuit devices, such requirement is tightened.

In conventional post-CMP cleaning, brushes were used to remove the residues on the wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
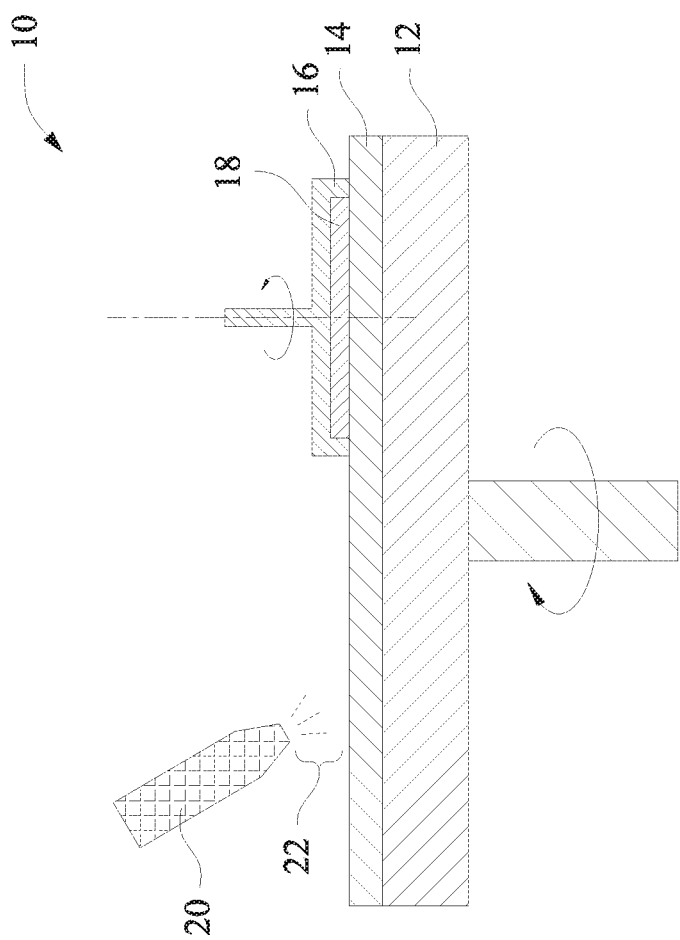
FIG. 1 illustrates Chemical Mechanical Polish (CMP) process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An apparatus for performing post Chemical Mechanical Polish (CMP) cleaning and the post-CMP cleaning process are provided in accordance with various exemplary embodiments. Some variations of some embodiments are discussed. Throughout the various views and illustrative embodiments, like reference numbers are used to designate like elements.

FIG. 1 schematically illustrates the CMP of a wafer in accordance with some embodiments of the present disclosure. CMP system 10 includes polishing platen 12, polishing pad 14 over polishing platen 12, and polishing head 16 over polishing pad 14. Slurry dispenser 20 has an outlet directly over polishing pad 14 in order to dispense slurry onto polishing pad 14.

During the CMP, slurry 22 is dispensed by slurry dispenser 20 onto polishing pad 14. Slurry 22 includes a reactive chemical(s) that react with the surface layer of wafer 18. Furthermore, slurry 22 includes abrasive particles for mechanically polishing wafer 18.

Polishing pad 14 is formed of a material that is hard enough to allow the abrasive particles in the slurry to mechanically polish the wafer, which is under polishing head 16. On the other hand, polishing pad 14 is also soft enough so that it does not substantially scratch the wafer. During the CMP process, polishing platen 12 is rotated by a mechanism (not shown), and hence polishing pad 14 fixed thereon is also rotated along with polishing platen 12. The mechanism (such as a motor and/or a gear) for rotating polishing pad 14 is not illustrated.

During the CMP process, polishing head 16 is also rotated, and hence causing the rotation of wafer 18 fixed onto polishing head 16. In accordance with some embodiments of the present disclosure, polishing head 16 and polishing pad 14 rotate in the same direction (clockwise or counter-clockwise). In accordance with alternative embodiments, as shown in FIG. 1, polishing head 16 and polishing pad 14 rotate in opposite directions. The mechanism for rotating polishing head 16 is not illustrated. With the rotation of polishing pad 14 and polishing head 16, slurry 22 flows between wafer 18 and polishing pad 14. Through the chemical reaction between the reactive chemical in the slurry and the surface layer of wafer 18, and further through the mechanical polishing, the surface layer of wafer 18 is planarized.

After the CMP, wafer 18 is cleaned through a post-CMP cleaning step. The post-CMP cleaning step may include a plurality of steps including and not limited to, cleaning using an acidic chemical solution, cleaning using an alkaline chemical solution, cleaning using a neutral chemical solution, and rinsing with De-ionized water (DI water). The post-CMP cleaning may also include a plurality of cycles, each including a chemical solution cleaning step and a rinsing step.

Figure 2A:
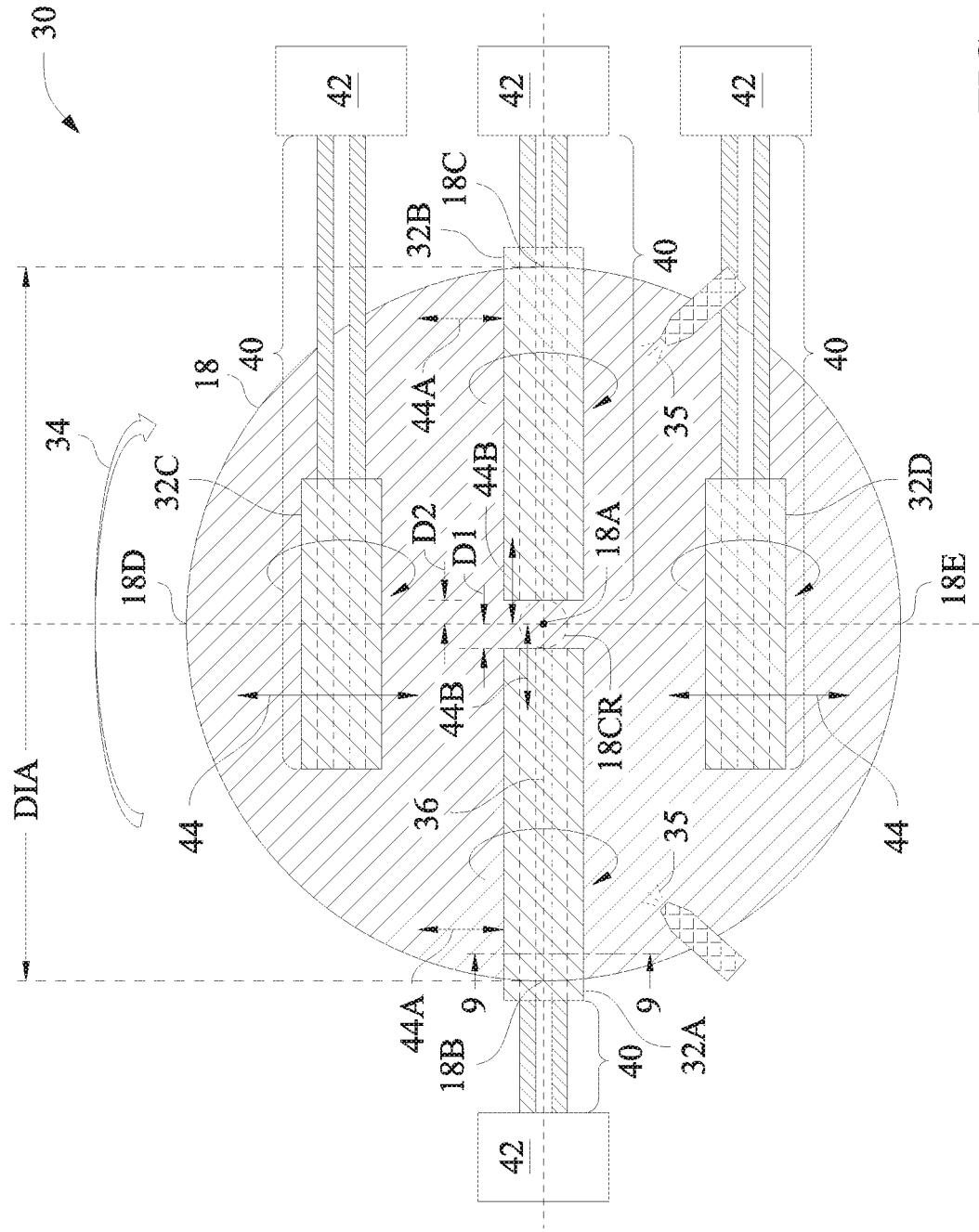
FIG. 2A illustrates a top view of a post-CMP cleaning process and a portion of a post-CMP cleaning apparatus in accordance with some embodiments, wherein four brushes are used.

FIG. 2A illustrates a top view of a stage in the post-CMP cleaning and the respective cleaning apparatus 30 in accordance with some embodiments. Wafer 18, which has been undertaken the CMP process, has residues left on the surface of wafer 18, and the residues need to be removed from wafer 18. The residues may include organic matters and particles. The cleaning process is referred to as post-CMP cleaning process.

Figure 9:
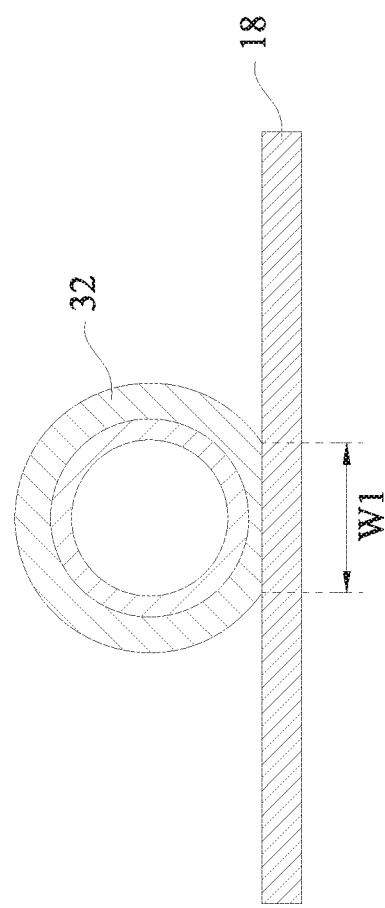
FIG. 9 illustrates a top view of a brush and a wafer, wherein the contact area between the brush and the wafer has a contact width.

The cleaning apparatus 30 includes a plurality of brushes (also sometimes referred to as brush rollers due to their circular cross-sectional shapes) 32 (including 32A, 32B, 32C, and 32D). Brushes 32A, 32B, 32C, and 32D may be formed of Polyvinyl Alcohol (PVA) in accordance with some embodiments of the present disclosure, or may be formed of other materials. Furthermore, Brushes 32A, 32B, 32C, and 32D may be made to have the form of sponges. During the post-CMP cleaning process, wafer 18 is rotated, for example, as illustrated by arrow 34. In the meantime, brushes 32A, 32B, 32C, and 32D also rotate with respective to their own axes. The axes of brushes 32A, 32B, 32C, and 32D are in the lengthwise directions of the respective brushes, and are parallel to the surface of wafer 18. Brushes 32A, 32B, 32C, and 32D have a cylindrical shape. Also, when viewed from right as shown in FIG. 2, the cross-sectional view of each of brushes 32A, 32B, 32C, and 32D is circular, as shown in FIG. 9 (marked as 32 in FIG. 9), and hence when the brushes rotate, residues are removed from the surface of wafer 18. In accordance with these embodiments, the length of each of brushes 32A may be smaller than diameter DIA of wafer 18, and may be equal to, greater than, or smaller than, radius DIA/2 of wafer 18.

Each of brushes 32A, 32B, 32C, and 32D is fitted to an end portion of a respective connecting component 40, which is configured to support the respective brushes 32A, 32B, 32C, and 32D. When connecting component 40 is rotated, brushes 32A, 32B, 32C, and 32D are also rotated. In accordance with some embodiments, connecting component 40 is hollow with a space therein, and DI water and/or chemical solutions may be passed through the space into brushes 32A, 32B, 32C, and 32D, and dispensed onto brushes 32A, 32B, 32C, and 32D. In addition, each of brushes 32A, 32B, 32C, and 32D is connected to one of driving components 42, which is configured to rotate and/or move the respective connecting component 40 and the respective brush. Accordingly, with the operation of the driving mechanism 42, brushes 32A, 32B, 32C, and 32D may be rotated and/or moved, as will be discussed in detail in subsequent discussion. The driving components 42 may include, for example, motors, gliding guides, robot arms, gears (not shown), and the like.

During the cleaning, chemical solution (referred to as cleaning solution hereinafter) 35 is sprayed onto the surface of wafer 18. Cleaning solution 35 may include various types, and different types of cleaning solution 35 may be used to clean different residues on wafers. In accordance with some embodiments, cleaning solution 35 includes an acid chemical solution, which may include an organic acid such as citric acid, an inorganic acid such as $HNO_3$, or the like. In accordance with some embodiments, cleaning solution 35 includes an alkaline chemical solution, which may include an organic base such as $NR_3$ (with R being alkyl), an inorganic base such as $NH_4OH$, or the like. Surfactants such as sodium dodecyl sulfate may be added into cleaning solution 35 to reduce the surface tension of cleaning solution 35. Cleaning solution 35 may include water as a solvent. Cleaning solution 35 may also use organic solvents such as methanol. Cleaning solution 35 may also be an aqueous solution including peroxide. For example, cleaning solution 35 may include $H_2O_2$ in water. With the rotation of wafer 18, cleaning solution 35 is rolled into brushes 32A, 32B, 32C, and 32D, which use cleaning solution 35 to clean the surface of wafer 18 when they rotate.

In accordance with some embodiments of the present disclosure, the locations of brushes 32A, 32B, 32C, and 32D are fixed, although brushes 32A, 32B, 32C, and 32D also roll by themselves. The lengthwise direction of brush 32A may be aligned to a diameter 36 of wafer 18. Furthermore, brush 32A is disposed on the left side of wafer center 18A. The right edge of brush 32A is also on the left side of wafer center 18A, and is spaced apart from wafer center 18A of wafer 18 by distance D1. In accordance with some exemplary embodiments, distance D1 is equal to a half of the contact width between brush 32A and wafer 18. For example, FIG. 9 illustrates a cross-sectional view of a portion of the structure shown in FIG. 2, wherein the cross-sectional view is obtained from the plane crossing line 9-9 in FIG. 2. As shown in FIG. 9, brush 32 contacts wafer 18 and have a contact area, and the contact area has width W1. In accordance with some embodiments, distance D1 is equal to W½. In accordance with alternative embodiments of the present disclosure, distance D1 is greater than or smaller than W½.

Referring to FIG. 2A again, brush 32B may also be disposed on wafer 18. The lengthwise direction of brush 32B may also be aligned to diameter 36 of wafer 18. Furthermore, brush 32B is disposed on the right side of wafer 18, and hence is spaced apart from brush 32A. The left edge of brush 32B is on the right side of wafer center 18A, and is spaced apart from wafer center 18A by distance D2. In accordance with some exemplary embodiments, distance D2 is equal to W½, wherein W1 is the contact width between brush 32B and wafer 18, as shown in FIG. 9. Distance D2 may also be equal to, greater than, or smaller than distance D1. Also, distance D2 may be greater than or smaller than W½.

Brush 32A may cover all the way to the left edge 18B of wafer 18 in accordance with some embodiments, and may extend slightly beyond (toward left) left edge 18B of wafer 18. It is noted that since wafer 18 is being rotated, when the "upper edge," "bottom edge," "left edge," and "right edge," are referred to throughout the description, these term refer to the geographical locations on wafer 18 at a time wafer 18 is viewed, rather than the fixed points that rotate with wafer 18. With the rotation of both wafer 18 and brush 32A, brush 32A is able to brush all of wafer 18 except center region 18CR, with the center region 18CR having a radius equal to distance D1. In accordance with some embodiments, the left edge of brush 32A is on the right side of left edge 18B. Accordingly, the length of brush 32A is smaller than the radius DIA/2 of wafer 18 in accordance with some embodiments.

Similarly, brush 32B may cover all the way to the right edge 18C of wafer 18, and may extend slightly beyond (toward right) the right edge 18C of wafer 18. Accordingly, with the rotation of both wafer 18 and brush 32B, brush 32B is able to brush all of wafer 18 except center region 18CR, with the center region having a radius equal to distance D2. In accordance with some embodiments, the right edge of brush 32B is on the left side of right edge 18C. Accordingly, the length of brush 32B is smaller than the radius DIA/2 of wafer 18.

Figure 2B:
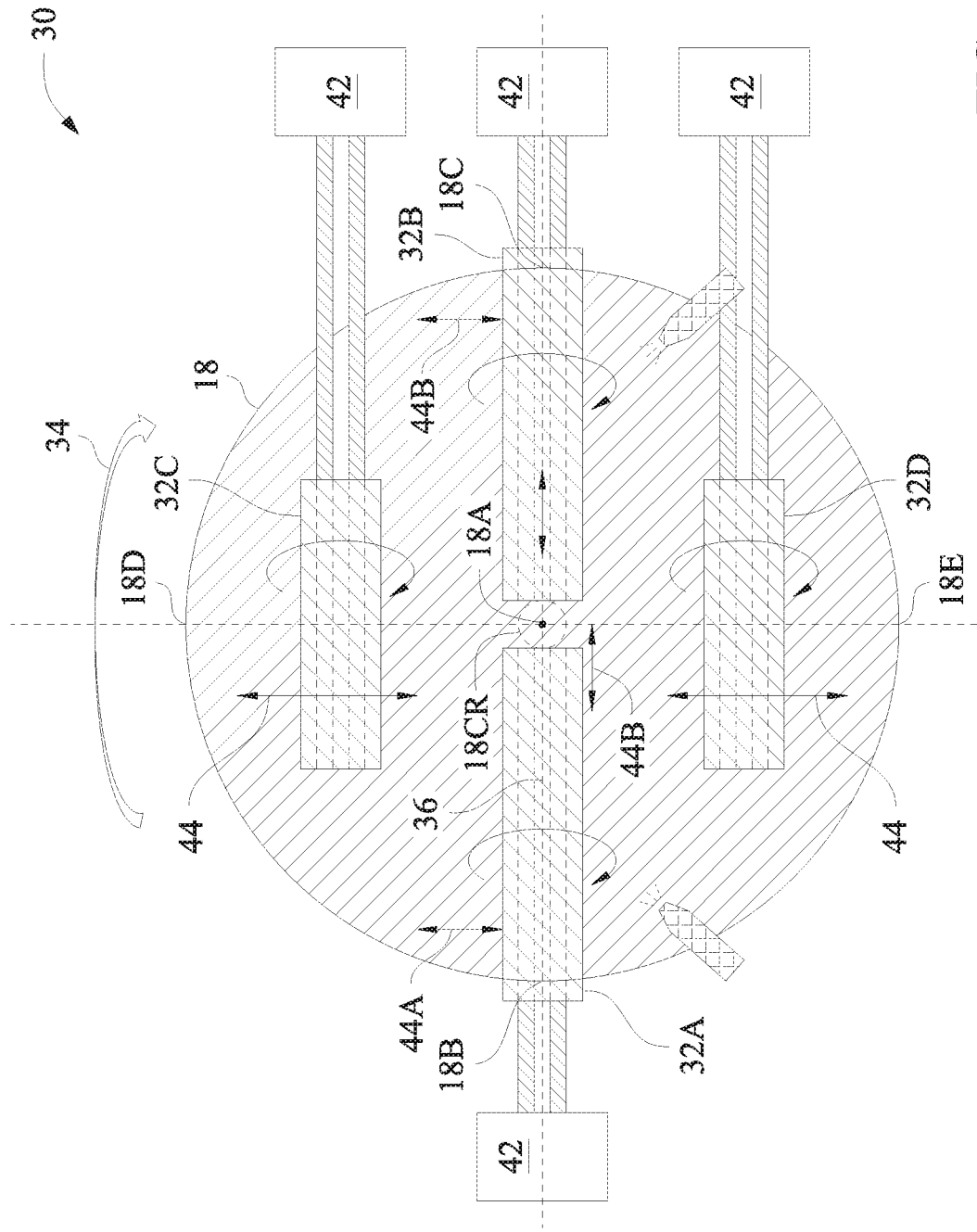
FIG. 2B illustrates a top view of a post-CMP cleaning process and a portion of a post-CMP cleaning apparatus in accordance with some embodiments, wherein one of the brushes has an end aligned to a center of the wafer.

In accordance with some embodiments, as shown in FIG. 2B, brush 32A has the right edge spaced apart from center 18A by distance D1, which may be equal to, smaller than, or greater than, a half of the contact width (W½, FIG. 9). On the other hand, the left edge of brush 32B extends to be aligned with wafer center 18A. Accordingly, brush 32B is able to clean substantially the entirety of wafer 18.

In conventional post-CMP processes, a single long brush was used, which extends from one edge to the opposite edge of the wafer that is polished. Accordingly, when wafer 18 is rotated, the edge portions of wafer 18 are cleaned when they rotate directly underlying and in contact with the respective brush, and not cleaned when they rotate away from the brush. However, the wafer has a center portion that has the diameter equal to the contact width (as shown in FIG. 9). The center portion is always in contact with the brush regardless of which edge portions of the wafer are being brushed, and is always brushed. This may cause the center portion of the wafer to be over-brushed. The center portion may be damaged or degraded due to the longer duration the sheer force applied to the center portion than to the edge portions. In addition, since water may be used, either in the cleaning solution or in the form of DI water, and water has a low electrical conductivity, charges may build up in some parts of the wafer due to longer contacting of the brush to these regions, causing the corrosion of these portions including the center portion of the wafer.

In the embodiments of the present disclosure, by using two brushes, with at least one, and possibly both brushes not extending to the center region 18CR of wafer 18, the damage/corrosion caused by the over-abrasion of brushes to the wafer is reduced. For example, in the embodiments shown in FIG. 2B, the brushing to the center region of wafer 18 is reduced by a half. In the embodiments in FIG. 2A, the center region of wafer 18 is not brushed and cleaned. Instead, the center region 18CR is cleaned in another cleaning process, which may be performed using a pencil-type brush.

In accordance with some embodiments of the present disclosure, brush 32C is further disposed on wafer 18, and is used to clean wafer 18. Brush 32C has a lengthwise direction parallel to the lengthwise direction of brushes 32A and 32B, and hence the lengthwise direction of brush 32C is parallel to diameter 36. Brush 32C is misaligned from diameter 36, to which brushes 32A and 32B are aligned. The center of brush 32C may be aligned to a point that is between center 18A and the upper edge 18D of wafer 18.

In accordance with some embodiments of the present disclosure, brush 32D is disposed on wafer 18, and is used to clean wafer 18 also. Brush 32D also has a lengthwise direction parallel to the lengthwise direction of brushes 32A and 32B, and the lengthwise direction is parallel to diameter 36. Brush 32D is misaligned from diameter 36E, to which brushes 32A and 32B are aligned. The center of brush 32C may be aligned to a point that is between center 18A and the lower edge 18E of wafer 18.

Brushes 32C and 32D may have the same lengths or may have different lengths. In addition, the distance from brush 32C to wafer center 18A may be equal to or different from the distance from brush 32D to wafer center 18A.

The damage/corrosion of wafers during the cleaning processes include center mode, middle mode, and edge mode, which correspond to the damage/corrosion of the center region, middle region, and edge region of the wafers. By adjusting the lengths and the locations of brushes 32A, 32B, 32C, and 32D, the brushing to wafer 18 may be more uniform, and the portions of the wafer that suffer from the damage/corrosion may be brushed less, so that the damage/corrosion is reduced without sacrificing the quality of the cleaning process.

Referring back to FIG. 2A again, in accordance with some embodiments of the present disclosure, each of brushes 32A, 32B, 32C, and 32D may be configured to move (or may be fixed in location) when rotating. The double headed arrows 44 (also include 44A and 44B) schematically illustrate the movement direction and the movement range of the brushes. For example, brush 32A may move left and right, as shown by arrow 44B. The rightmost boundary of the movement range is wafer center 18A. When the right edge of brush 32A reaches wafer center 18A, brush 32A starts to move back to the left until it reaches the left end of the movement range. The right boundary of the movement range may also be any point to the left of wafer center 18A. Brush 32A may start moving back to the right when the right edge of brush 32A has distance D1 equal to a half of the contact width W1 (FIG. 9), or when distance D1 is greater than or smaller than W½.

Brush 32A may also move up (or down), as shown by arrow 44A. It is noted when the terms "up" and "down" are used, these terms refer to the positions found in the top view of wafer 18. If viewed in a cross-sectional view of wafer 18, when brushes move "up" or "down," they are still at the same level, and the contact area between the brushes and wafer 18 remains unchanged. In accordance with some embodiments of the present disclosure, a first end of the movement range is as shown in FIG. 2A, wherein the center axis of brush 32A is aligned to diameter 36. The extending direction of the center axis of brush 32A is also its lengthwise direction. At this position, brush 32A has a first contact area with wafer 18. The movement range may be equal to or greater than contact width W1 (FIG. 9). Accordingly, when brush 32A reaches the second end of the movement range, brush 32A and wafer 18 have a second contact area, which does not overlap the first contact area.

Similar to brush 32A, brush 32B may move left and right, and/or up and down, as shown by arrows 44A and 44B. Similarly, brush 32B may move toward the left until its left edge reaches wafer center 18A, at which time brush 32B will start moving back to the right. Brush 32B may also move toward the left, and then move toward the right before its left edge reaches wafer center 18A. Also, brush 32B may move up and down similar to brush 32A. Brushes 32A and 32B may move in a synchronized mode, for example, simultaneously moving to the right, and then simultaneously moving to the left; or simultaneously moving upwardly, and then simultaneously moving downwardly.

Brushes 32C and 32D may also move up and down to compensate for the non-uniformity in the brushing of different areas of wafer 18. The optimal locations and movement swing ranges of brushes 32A, 32B, 32C, and 32D may be determined by inspecting the previously cleaned wafers, and adjusting the locations and the movement ranges accordingly, so that over-brushed regions are brushed less, and under-brushed regions are brushed more.

Figure 3:
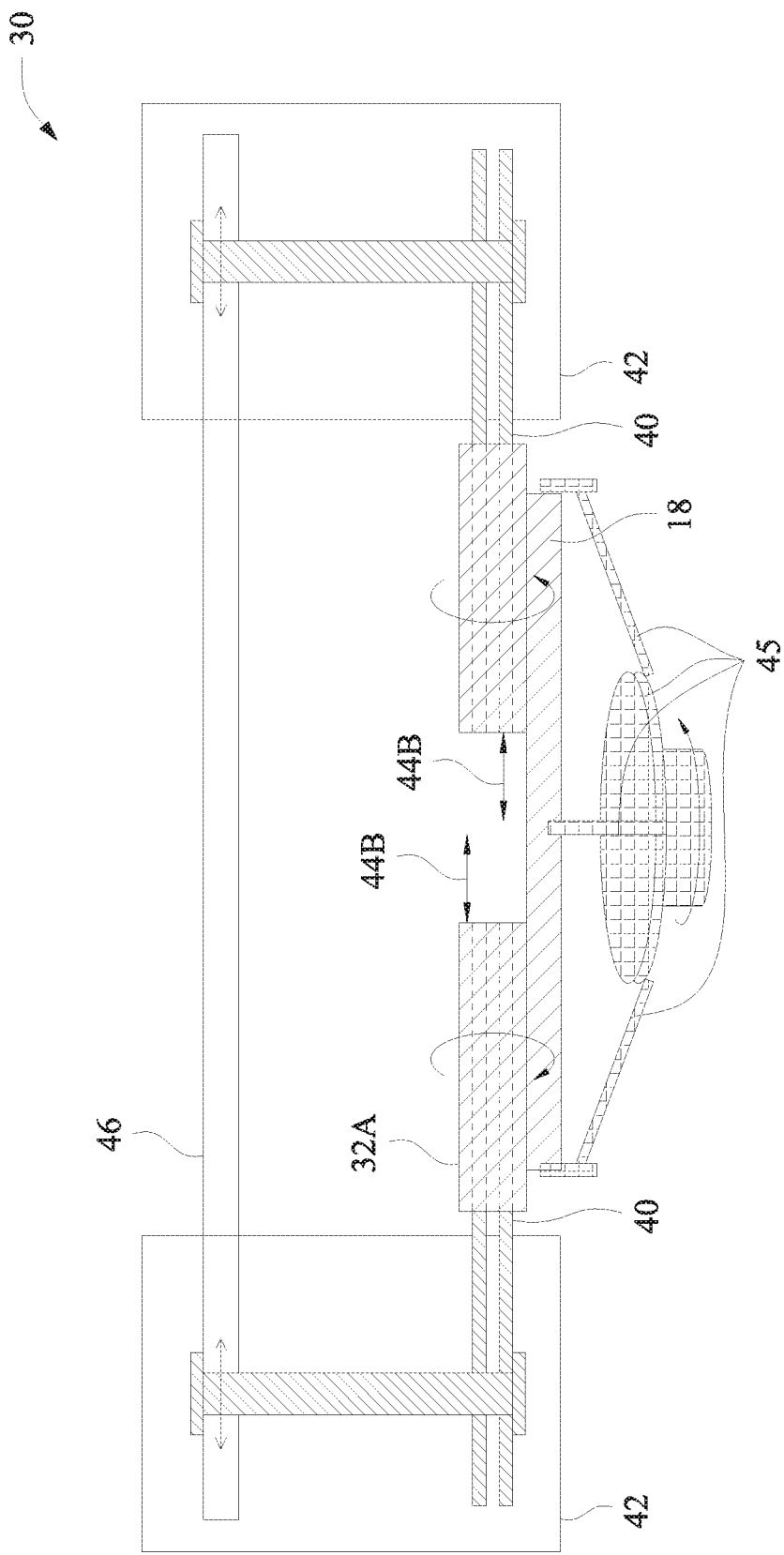
FIG. 3 illustrates a cross-sectional view of a post-CMP cleaning process and a portion of a post-CMP cleaning apparatus in accordance with some embodiments.

FIG. 3 illustrates a cross-sectional view of the structure in FIG. 2, wherein the cross-sectional view is obtained in the plane containing diameter 36. Wafer 18 is placed on and secured by chuck 45, which is rotated, and hence the overlying wafer 18 is rotated also. In accordance with some exemplary embodiments of the present disclosure, driving component 42 includes gliding guide 46, to which connecting components 40 are attached. By driving connecting component 40 to glide along gliding guide 46, brushes 32A and 32B may move back and forth. In accordance with alternative embodiments, the movement of brushes may be achieved by using other mechanisms such as robot arms.

Figure 4:
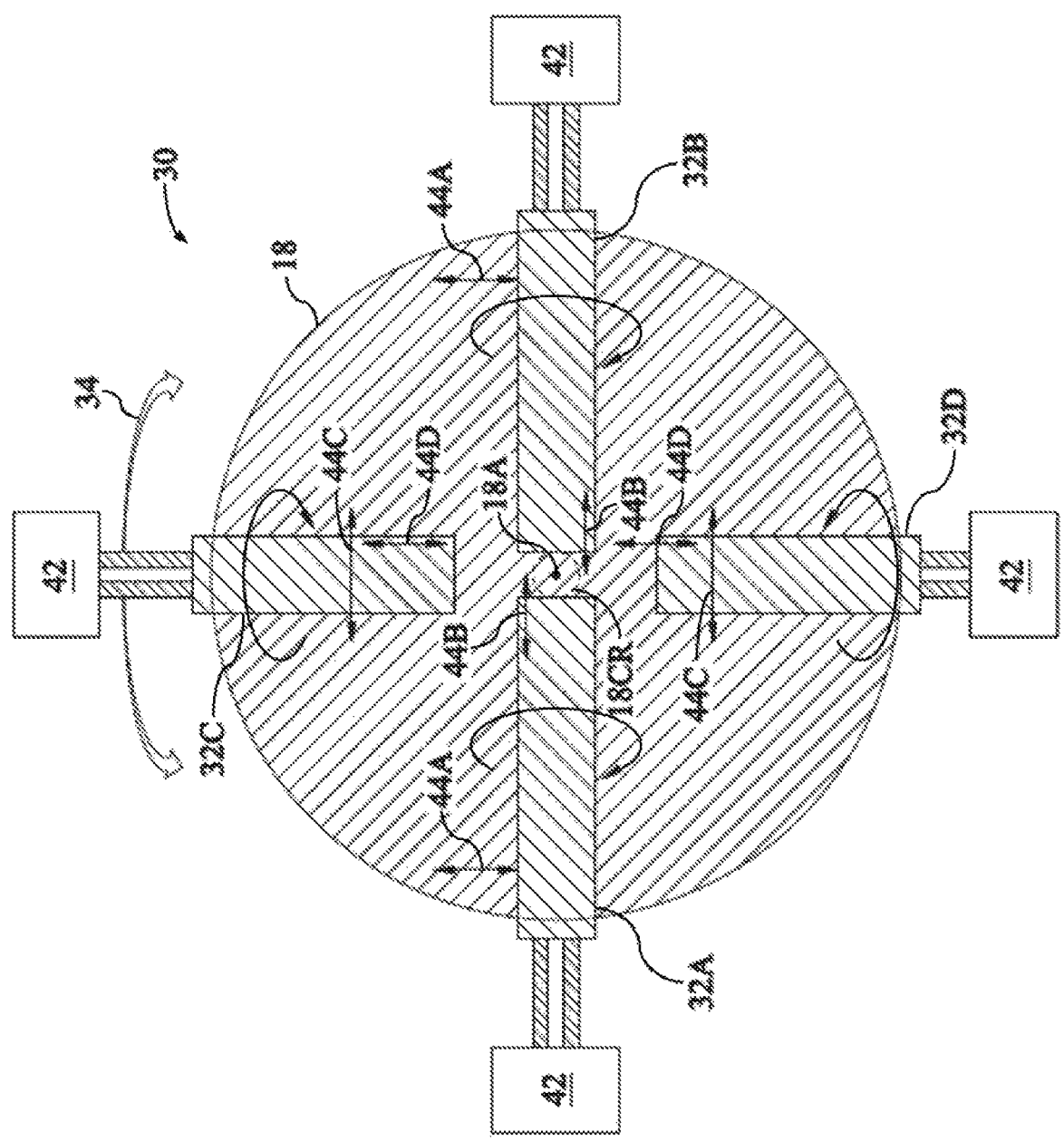
FIG. 4 illustrates a top view of a post-CMP cleaning process and a portion of a post-CMP cleaning apparatus in accordance with some embodiments, wherein two brushes are perpendicular to other two brushes.

FIG. 4 illustrates the apparatus and the cleaning process in accordance with some embodiments. These embodiments are similar to the embodiments shown in FIG. 2A, except brushes 32C and 32D have their lengthwise directions perpendicular to the lengthwise direction of brushes 32A and 32B. By applying brushes 32C and 32D, the throughput of the post-CMP cleaning is increased. Again, each of brushes 32C and 32D may be moved in the directions represented by arrows 44C and/or 44D.

Figure 5:
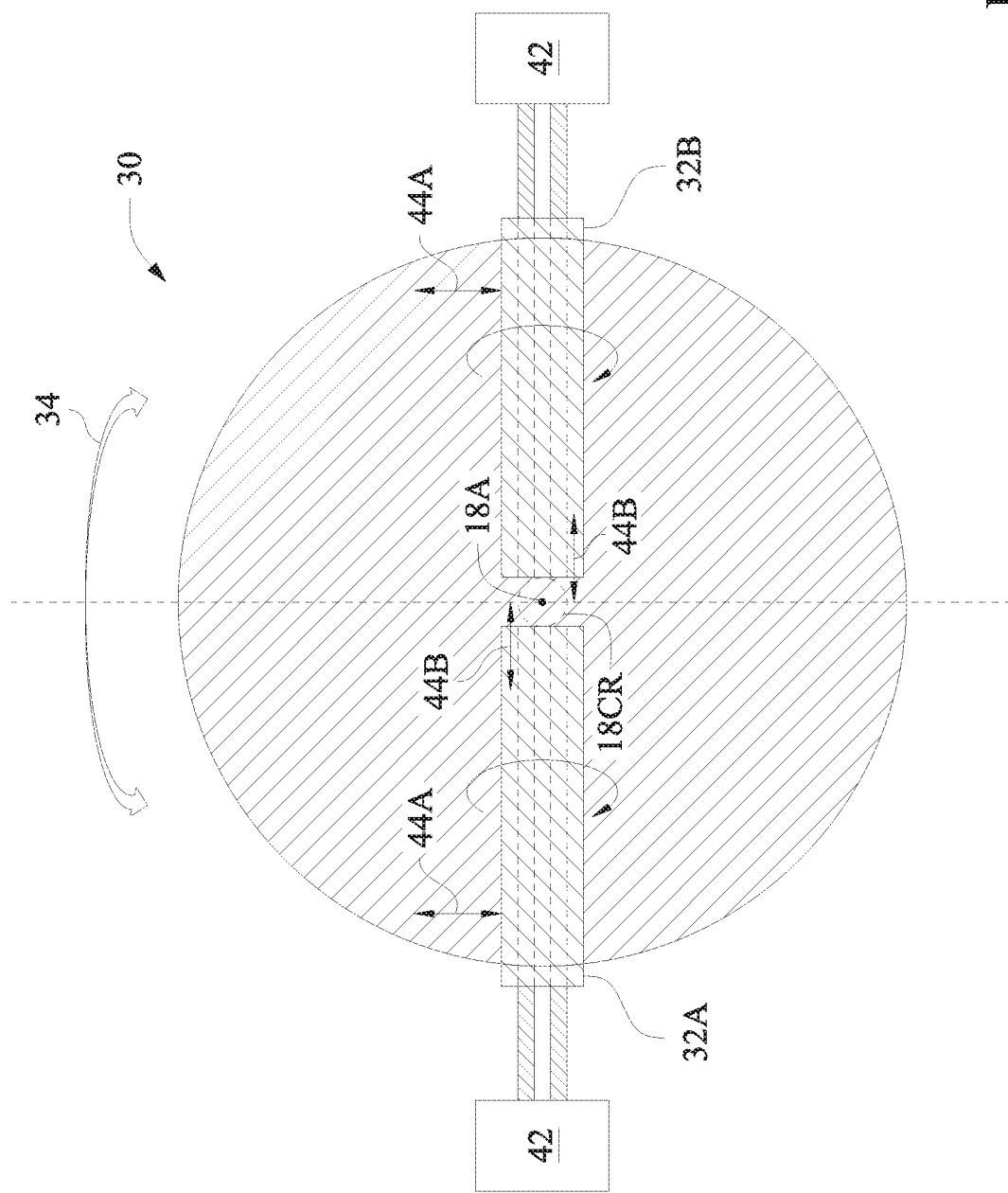
FIG. 5 illustrates a top view of a post-CMP cleaning process and a portion of a post-CMP cleaning apparatus in accordance with some embodiments, wherein two brushes are used.

FIG. 5 illustrates the apparatus and the post-CMP cleaning process in accordance with some embodiments. These embodiments are similar to the embodiments shown in FIG. 2A, except brushes 32C and 32D in FIG. 2A are not used. The structure and operation of brushes 32A and 32B may be essentially the same as described for brushes 32A and 32B in FIG. 2A, and hence are not repeated herein.

Figure 6:
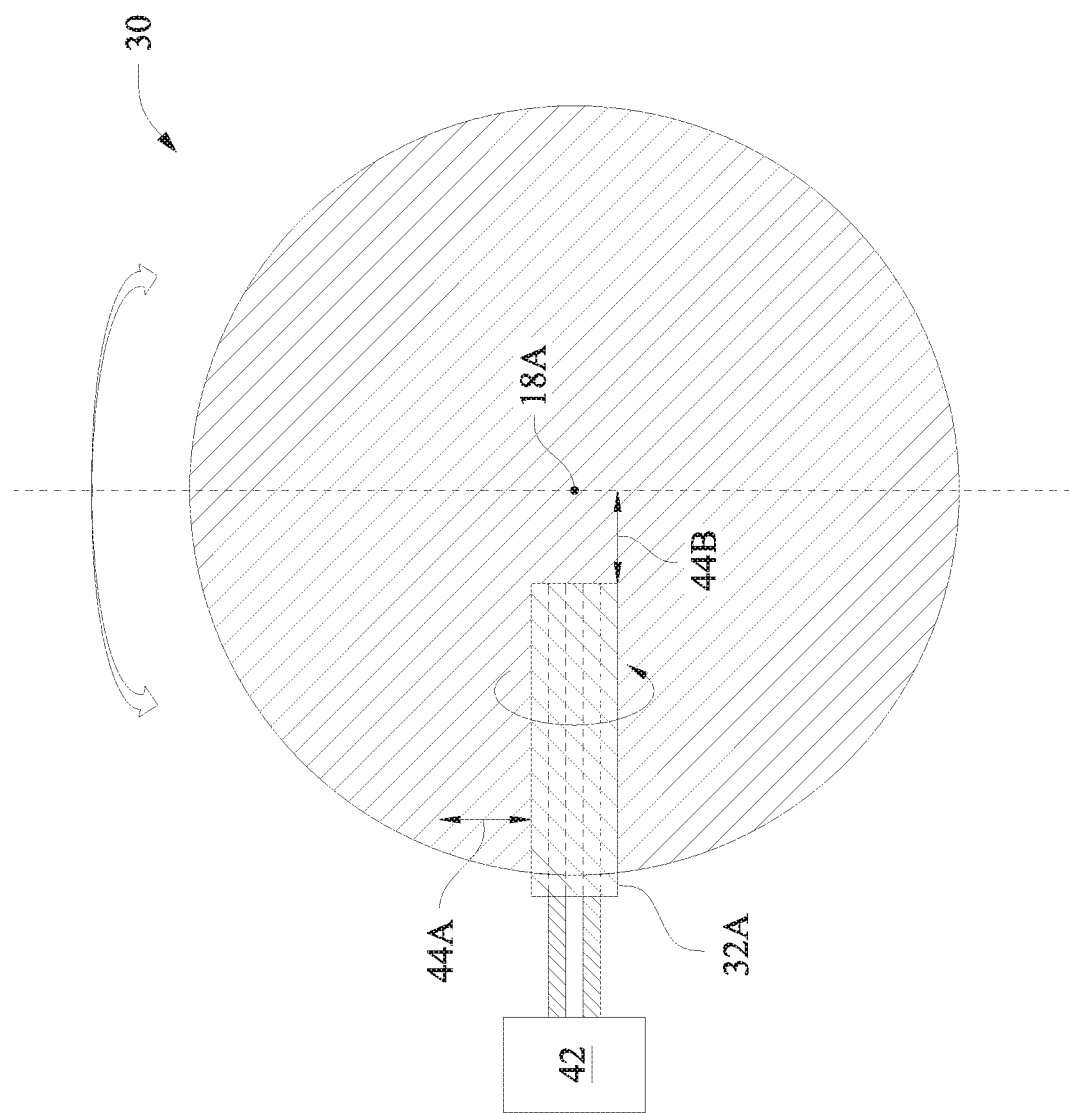
FIG. 6 illustrates a top view of a post-CMP cleaning process and a portion of a post-CMP cleaning apparatus in accordance with some embodiments, wherein a single brush is used.

FIG. 6 illustrates the apparatus and the post-CMP cleaning process in accordance with some embodiments. These embodiments are similar to the embodiments shown in FIG. 2A, except brushes 32B, 32C, and 32D in FIG. 2A are not used, and a single brush 32A is used. The structure and operation of brush 32A may be essentially the same as described for brush 32A in FIG. 2A, and hence are not repeated herein.

Figure 7:
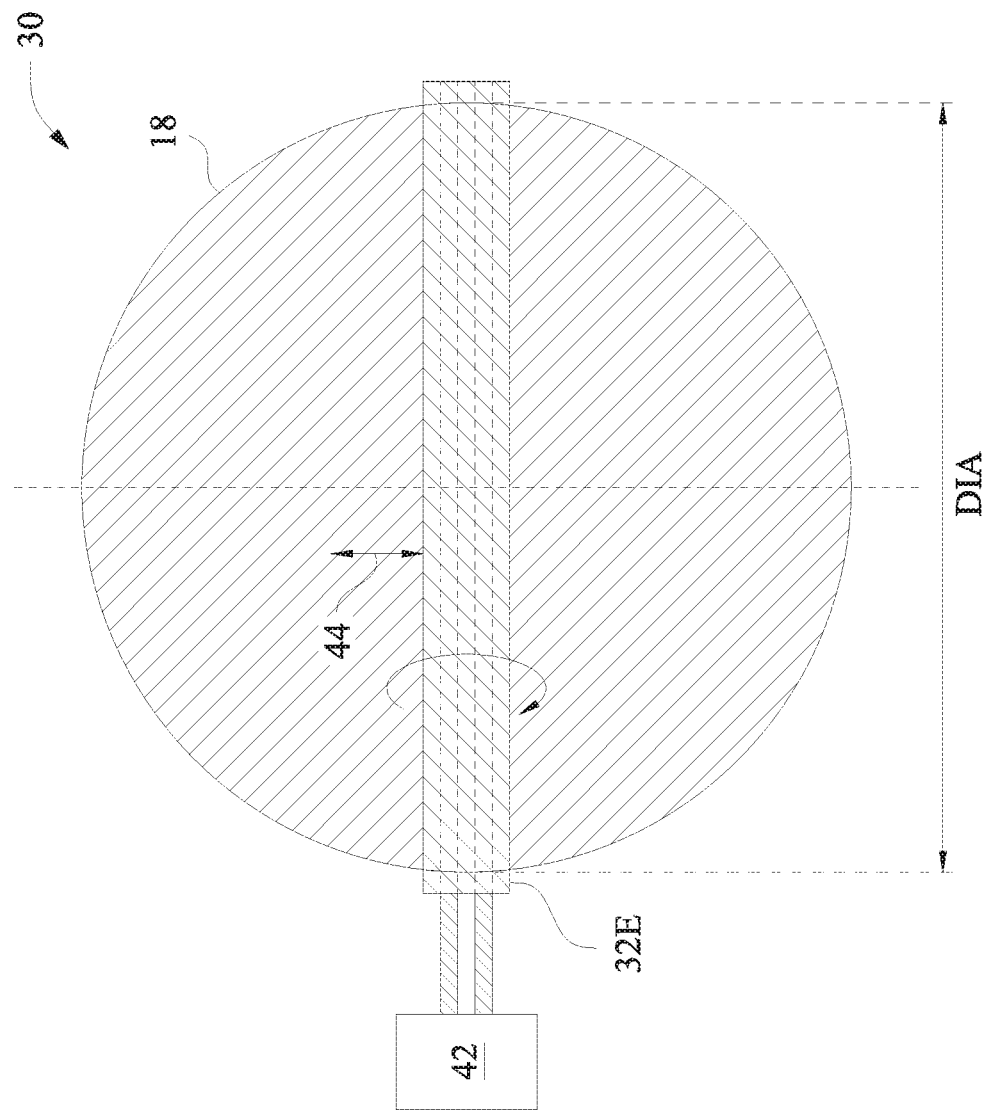
FIG. 7 illustrates a top view of a post-CMP cleaning process and a portion of a post-CMP cleaning apparatus in accordance with some embodiments, wherein a long brush moves during the cleaning.

FIG. 7 illustrates the apparatus and the post-CMP cleaning process in accordance with some embodiments. In these embodiments, brush 32E has a length equal to or greater than diameter DIA of wafer 18. Accordingly, at any given time, the brushed region crosses the entire diameter of wafer 18. Brush 32E is configured to move swing up and down, as shown by double headed arrow 44, so that the center region is not over-brushed. A first end of the movement swing may be as shown in FIG. 7, wherein the center axis of brush 32E is aligned to a diameter of wafer 18. The movement range (distance) may be equal to or greater than contact width W1 as shown in FIG. 9 in accordance with some embodiments. The movement range (distance) may also be smaller than contact width W1.

Figure 8:
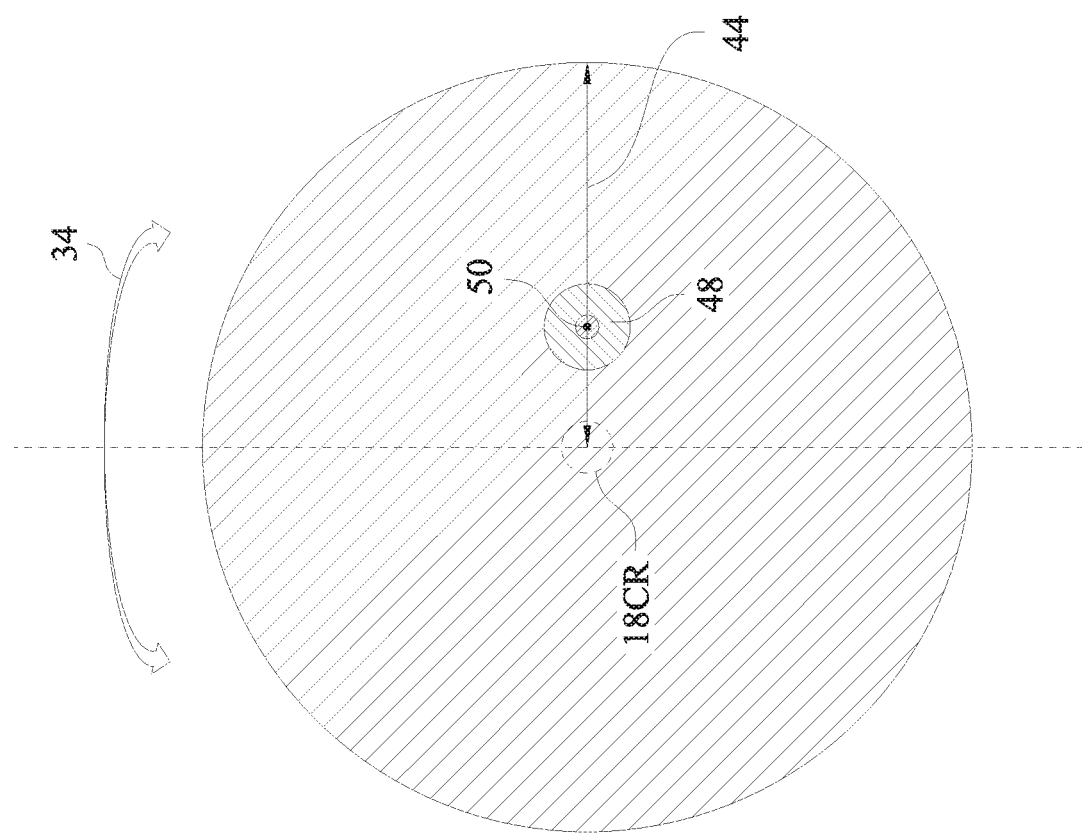
FIG. 8 illustrates a top view of a post-CMP cleaning process and a portion of a post-CMP cleaning apparatus in accordance with some embodiments, wherein a pencil-type brush is used.

FIG. 8 illustrates a top view of a pencil-type brush 48, wherein pencil-type brush 48 is used to further clean wafer 18. Pencil-type brush 48 may rotate round its axis 50. Pencil-type brushing differs from the brushing using brush roller (as shown in FIGS. 2A through 7) in that in FIGS. 2A through 7, the rotation axes of brushes 32 are parallel to the surface of wafer 18, while in FIG. 8, the rotation axis of brush 48 is perpendicular to the surface of wafer 18. In addition, pencil-type brush 48 may move between, and cover, the center and the edge of wafer 18, wherein the movement range is illustrated as double headed arrow 44. Accordingly, the wafer center region 18CR, which is not brushed in accordance with some embodiments, may be brushed.

After the post-CMP cleaning step, the wafer is dried, for example, using isopropanol and nitrogen gas.

The embodiments of the present disclosure have some advantageous features. By redesigning the size and the location of brushes, and modifying the operation of brushes, the damage/corrosion observed in conventional post-CMP cleaning process may be reduced.

In accordance with some embodiments of the present disclosure, a method includes performing a first post-CMP cleaning on a wafer using a first brush. The first brush rotates to clean the wafer. The method further includes performing a second post-CMP cleaning on the wafer using a second brush. The second brush rotates to clean the wafer. The first post-CMP cleaning and the second post-CMP cleaning are performed simultaneously.

In accordance with some embodiments of the present disclosure, a method includes performing a post-CMP cleaning on a wafer using a brush. The brush rotates to clean the wafer, and a rotation axis of the brush is parallel to a surface of the wafer. When the brush rotates, the first brush swings.

In accordance with some embodiments of the present disclosure, an apparatus for performing a cleaning on a wafer includes a chuck configured to hold and rotate the wafer, a first brush having a first axis parallel to a surface of the wafer, a first driving mechanism for rotating the first brush, a second brush having a second axis parallel to the surface of the wafer, and a second driving mechanism for rotating the second brush.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for performing a cleaning on a wafer, the apparatus comprising:

a chuck configured to hold and rotate the wafer;
a first brush having a first axis parallel to a first surface of the wafer;
a first driving mechanism for rotating the first brush;
a second brush having a second axis parallel to the first surface of the wafer;
a second driving mechanism for rotating the second brush, wherein the first brush and the second brush rotate around a first rotation axis; and
a third brush having a third axis parallel to the first surface of the wafer, wherein the third brush rotates around a second rotation axis offset from the first rotation axis, wherein the first brush, the second brush, and the third brush are disposed on the first surface of the wafer.

2. The apparatus of claim 1, wherein the first driving mechanism is further configured to move the first brush.

3. The apparatus of claim 2, wherein the second driving mechanism is further configured to move the second brush.

4. The apparatus of claim 1, wherein the first driving mechanism is configured to move the first brush in a direction parallel to the first axis.

5. The apparatus of claim 1, wherein the first driving mechanism is configured to move the first brush in a direction perpendicular to the first axis.

6. The apparatus of claim 1, wherein the first driving mechanism is connected to the second driving mechanism through a gliding guide.

7. The apparatus of claim 1, further comprising a fourth brush having a fourth axis parallel to the first surface of the wafer, wherein the fourth brush is disposed on the first surface of the wafer.

8. The apparatus of claim 7, wherein the third axis and the fourth axis are parallel to the first axis and the second axis.

9. The apparatus of claim 7, wherein the third axis and the fourth axis are perpendicular to the first axis and the second axis.

10. An apparatus comprising:
a wafer holding chuck;
a first brush over the wafer holding chuck;
a second brush over the wafer holding chuck;
a third brush over the wafer holding chuck, wherein the first brush, the second brush, and the third brush are over the wafer holding chuck in a first direction, and wherein the first brush, the second brush, and the third brush are disposed in a first plane perpendicular to the first direction;
a first driving component attached to the first brush, and a gliding guide; and
a second driving component attached to the second brush and the gliding guide.

11. The apparatus of claim 10, wherein the first driving component and the second driving component are configured to glide along the gliding guide in a first direction.

12. The apparatus of claim 11, wherein the first brush has a first longitudinal axis parallel to the first direction and the second brush has a second longitudinal axis parallel to the first direction.

13. The apparatus of claim 12, wherein the first driving component is configured to move the first brush in the first direction and rotate the first brush around the first longitudinal axis, and wherein the second driving component is configured to move—the second brush in the first direction and rotate the second brush around the second longitudinal axis.

14. The apparatus of claim 11, wherein the wafer holding chuck is configured to rotate around an axis perpendicular to the first direction.

15. An apparatus comprising:
a chuck having an opening for holding a wafer, the chuck being configured to rotate the wafer around a first axis;
a first brush over the chuck, the first brush having a first longitudinal axis perpendicular to the first axis, wherein a first length of the first brush along the first longitudinal axis is equal to or less than half a diameter of the opening;
a second brush over the chuck, the second brush having a second longitudinal axis perpendicular to the first axis, wherein a second length of the second brush along the second longitudinal axis is equal to or less than half the diameter of the opening; and
a third brush over the chuck, the third brush having a third longitudinal axis perpendicular to the first axis, wherein the first longitudinal axis, the second longitudinal axis, and the third longitudinal axis are disposed in a first plane perpendicular to the first axis, and wherein the third longitudinal axis is offset from the first longitudinal axis and the second longitudinal axis.

16. The apparatus of claim 15, wherein the first longitudinal axis is disposed along the same axis as the second longitudinal axis.

17. The apparatus of claim 15, wherein the first longitudinal axis and the second longitudinal axis are aligned with a center of the opening.

18. The apparatus of claim 15, wherein a third length of the third brush along the third longitudinal axis is less than the first length or the second length.

19. The apparatus of claim 15, wherein the first brush has a first_movement range in a direction parallel with the first longitudinal axis, the first movement-range extending to a center of the opening.

20. The apparatus of claim 19, wherein the first brush has a second_movement range in a direction perpendicular to the first longitudinal axis and the first axis.

* * * * *